(12) United States Patent
Linn et al.

(10) Patent No.: US 7,692,127 B1
(45) Date of Patent: Apr. 6, 2010

(54) MEMS TYPE THERMALLY ACTUATED OUT-OF-PLANE LEVER

(75) Inventors: Eric H. Linn, Fort Mill, SC (US); Michael A. Deeds, Port Tobacco, MD (US); David Herman, Charlotte, NC (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 257 days.

(21) Appl. No.: 11/729,086

(22) Filed: Mar. 26, 2007

(51) Int. Cl.
*F42B 15/01* (2006.01)
*F42B 10/00* (2006.01)
*B81B 7/00* (2006.01)
*F42B 15/00* (2006.01)

(52) U.S. Cl. .................. 244/3.21; 244/3.1; 244/3.15

(58) Field of Classification Search ........... 244/3.1–3.3; 89/1.11; 310/300, 306, 307, 10, 12.01, 12.03
See application file for complete search history.

(56) References Cited

U.S. PATENT DOCUMENTS

| | | | |
|---|---|---|---|
| 5,788,178 A * | 8/1998 | Barrett, Jr. .................. 244/3.11 |
| 5,824,910 A | 10/1998 | Last et al. |
| 6,069,392 A | 5/2000 | Tai et al. |
| 6,175,170 B1 | 1/2001 | Kota et al. |
| 6,178,741 B1 * | 1/2001 | Nelson et al. ............... 244/3.22 |
| 6,201,230 B1 * | 3/2001 | Crowther et al. ........... 244/3.16 |
| 6,210,046 B1 | 4/2001 | Rogers et al. |
| 6,244,535 B1 * | 6/2001 | Felix .......................... 244/3.16 |
| 6,378,801 B1 * | 4/2002 | Pell et al. ................... 244/3.24 |
| 6,422,507 B1 * | 7/2002 | Lipeles ....................... 244/3.13 |
| 6,474,593 B1 | 11/2002 | Lipeles et al. |
| 6,596,976 B2 * | 7/2003 | Lin et al. ..................... 244/3.2 |
| 6,610,971 B1 * | 8/2003 | Crabtree ...................... 244/3.1 |
| 6,654,685 B2 * | 11/2003 | McIntyre ..................... 244/3.2 |
| 6,724,341 B1 * | 4/2004 | Pereira et al. ................. 244/3.1 |
| 6,725,173 B2 * | 4/2004 | An et al. ....................... 244/3.2 |
| 6,804,036 B1 | 10/2004 | Chen et al. |
| 6,853,765 B1 | 2/2005 | Cochran |
| 6,889,610 B2 * | 5/2005 | Boucher et al. ............ 244/3.22 |
| 6,986,302 B2 * | 1/2006 | LaFata ........................ 89/1.11 |
| 7,070,144 B1 * | 7/2006 | DiCocco et al. ............ 244/3.21 |

(Continued)

OTHER PUBLICATIONS

U.S. Appl. No. 11/729,089, filed Mar. 26, 2007, Deeds et al.

(Continued)

*Primary Examiner*—Bernarr E Gregory
(74) *Attorney, Agent, or Firm*—Fredric J. Zimmerman

(57) ABSTRACT

A MEMS apparatus includes a substrate; electrical contacts disposed on the substrate; a thermal arch beam supported by and connected between the contacts, the thermal arch beam including a midpoint and a protrusion located at about the midpoint; a lever having an axis of rotation and a bearing surface upon which the protrusion is operable to bear, a pair of lever supports disposed on the substrate for rotatably supporting the lever about the axis of rotation, an area of contact between the protrusion and the bearing surface being positioned vertically between the axis of rotation and the plane of the substrate. A voltage difference between the electrical contacts causes the thermal arch beam to move horizontally in the plane and the protrusion to bear against the lever causing rotation of the lever out of the plane.

13 Claims, 5 Drawing Sheets

U.S. PATENT DOCUMENTS

| | | | |
|---|---|---|---|
| 7,226,015 B1 * | 6/2007 | Prince et al. | 244/3.21 |
| 7,249,730 B1 * | 7/2007 | Flippen, Jr. | 244/3.15 |
| 7,328,104 B2 * | 2/2008 | Overstreet et al. | 244/3.2 |
| 7,425,918 B2 * | 9/2008 | Rastegar et al. | 244/3.1 |
| 2002/0190155 A1 * | 12/2002 | Lipeles et al. | 244/3.21 |
| 2003/0218102 A1 | 11/2003 | Van Dam et al. | |
| 2005/0115386 A1 * | 6/2005 | LaFata | 89/1.11 |
| 2007/0001051 A1 * | 1/2007 | Rastegar et al. | 244/3.1 |

OTHER PUBLICATIONS

U.S. Appl. No. 11/729,088, filed Mar. 26, 2007, Herman et al.

* cited by examiner

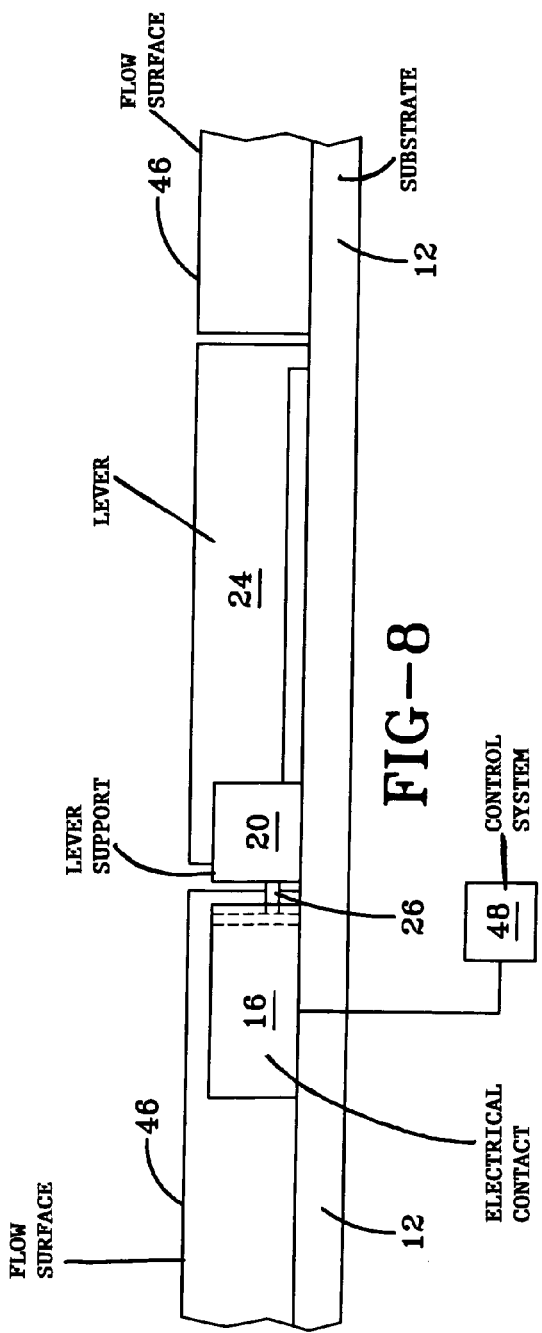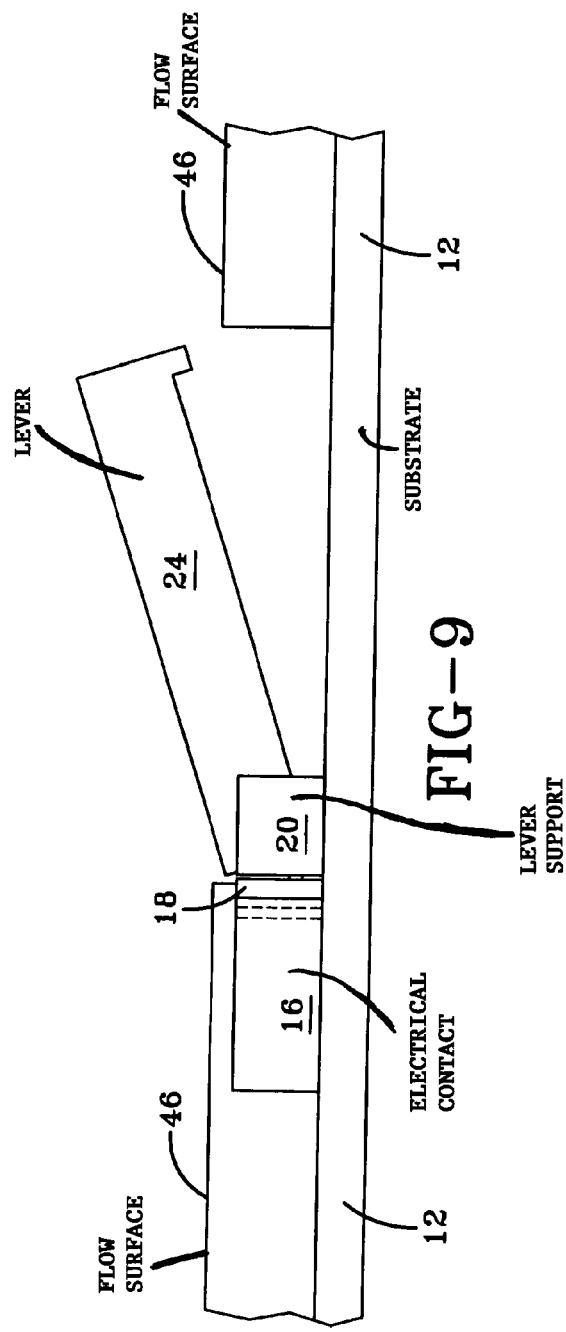

MEMS TYPE THERMALLY ACTUATED OUT-OF-PLANE LEVER

STATEMENT OF GOVERNMENT INTEREST

The invention described herein may be manufactured and used by or for the Government of the United States of America for government purposes without the payment of any royalties thereof.

BACKGROUND OF THE INVENTION

The invention relates in general to microelectromechanical (MEMS) devices and in particular to MEMS devices that provide deflection out of the plane of the MEMS substrate.

Conventional systems for guiding missiles or projectiles in flight use canards, or small wing-like structures, to steer the projectile. These structures are large (approximately 3" in length) and require motors to actuate. The stabilizing fins on the projectile have to be increased in size to counteract the effect the canards have of moving the center of pressure forward.

A MEMS control surface can reduce drag and hence increase the range of projectiles by eliminating the drag associated with canards and reducing the drag of the fins. In addition, MEMS control surfaces may reduce volume, weight, and power requirements, further increasing the projectile's range. Another added benefit of the MEMS control surface is the reduction of cost associated with batch fabrication techniques.

Known MEMS devices for producing a mechanical deflection include various types of thermally actuated beams, including cantilever and arch beams. These beams have proven successful in producing a deflection in the plane of the MEMS substrate. Devices such as projectile control surfaces, however, require a deflection out of the plane of the MEMS substrate, that is, in a direction perpendicular to the MEMS substrate.

One MEMS type apparatus that provides out-of-plane deflection is shown in U.S. Pat. No. 5,824,910 issued on Oct. 20, 1998 and entitled "Miniature Hydrostat Fabricated Using Multiple Microelectromechanical Processes." Another MEMS type apparatus that provides out-of-plane deflection is shown in U.S. Pat. No. 6,069,392 issued on May 30, 2000 and entitled "Microbellows Apparatus." These two U.S. patents are expressly incorporated by reference. A third MEMS type apparatus that provides out-of-plane deflection is shown in U.S. Pat. No. 6,474,593 issued on Nov. 5, 2002 and entitled "Guided Bullet."

The vertical deflection of a single diaphragm apparatus, like the hydrostat mentioned above, is limited by the diameter of the diaphragm and its thickness. A micro bellows apparatus is able to deliver much greater vertical deflections for a similar sized device. However, the deflections required to make an effective control surface are many times greater than a micro bellows alone can provide. The electrostatically actuated curved beam shown in U.S. Pat. No. 6,474,593 cannot withstand high-speed flow forces. A suitable control surface can be realized by combining a thermal arch beam apparatus with a lever that is rotatable out of plane.

SUMMARY OF THE INVENTION

It is an aspect of the invention to provide a MEMS apparatus that can provide vertical deflection, out of the plane of the MEMS substrate.

It is another aspect of the invention to provide a MEMS apparatus that can provide vertical deflections larger than known MEMS apparatus.

Yet another aspect of the invention is to provide a MEMS apparatus that is operable as a control surface for high-speed projectiles One aspect of the invention is a MEMS apparatus including a substrate defining a plane; a pair of electrical contacts disposed on the substrate; a thermal arch beam supported by and connected between the contacts, the thermal arch beam including a midpoint and a protrusion located at about the midpoint; a lever having an axis of rotation and a bearing surface upon which the protrusion is operable to bear; and a pair of lever supports disposed on the substrate for rotatably supporting the lever about the axis of rotation, an area of contact between the protrusion and the bearing surface being positioned vertically between the axis of rotation and the plane of the substrate; where a voltage difference between the pair of electrical contacts causes the thermal arch beam to move horizontally in the plane and the protrusion to bear against the lever causing rotation of the lever out of the plane. In an alternative embodiment, the lever further includes an opening formed in one end for receiving the protrusion of the thermal arch beam.

An embodiment of the MEMS apparatus includes openings in each of the pair of lever supports, a through hole in the lever and an axle disposed in the through hole and the openings in the lever supports, the axle being free to rotate with respect to the lever and the lever supports.

A second embodiment of the MEMS apparatus includes openings in each of the pair of lever supports and an axle fixed to the lever, the axle being disposed in the openings in the lever supports and free to rotate with respect to the lever supports.

A third embodiment of the MEMS apparatus includes a through hole in the lever and an axle fixed to the pair of lever supports, the axle being disposed in the through hole in the lever and free to rotate with respect to the lever.

A fourth embodiment of the MEMS apparatus includes an axle fixed to the lever and the pair of lever supports, the axle comprising a torsion spring operable to twist as the ramp rotates.

Another aspect of the invention is a projectile including a flow surface; and at least one MEMS apparatus including a substrate defining a plane; a pair of electrical contacts disposed on the substrate; a thermal arch beam supported by and connected between the contacts, the thermal arch beam including a midpoint and a protrusion located at about the midpoint; a lever having an axis of rotation and a bearing surface upon which the protrusion is operable to bear; and a pair of lever supports disposed on the substrate for rotatably supporting the lever about the axis of rotation, an area of contact between the protrusion and the bearing surface being positioned vertically between the axis of rotation and the plane of the substrate; where a voltage difference between the pair of electrical contacts causes the thermal arch beam to move horizontally in the plane and the protrusion to bear against the lever causing rotation of the lever out of the plane; the MEMS apparatus being disposed at the flow surface such that, in an off position of the MEMS apparatus the lever is substantially flush with the flow surface and in an on position of the MEMS apparatus the lever extends out of a plane of the flow surface.

An embodiment of the projectile includes openings in each of the pair of lever supports, a through hole in the lever and an axle disposed in the through hole and the openings in the lever supports, the axle being free to rotate with respect to the lever and the lever supports.

A second embodiment of the projectile includes openings in each of the pair of lever supports and an axle fixed to the lever, the axle being disposed in the openings in the lever supports and free to rotate with respect to the lever supports.

A third embodiment of the projectile includes a through hole in the lever and an axle fixed to the pair of lever supports, the axle being disposed in the through hole in the lever and free to rotate with respect to the lever.

A fourth embodiment of the projectile includes an axle fixed to the lever and the pair of lever supports, the axle comprising a torsion spring operable to twist as the ramp rotates.

In an exemplary embodiment, the projectile includes a plurality of the MEMS apparatus disposed at the flow surface.

BRIEF DESCRIPTION OF THE DRAWINGS

In the drawings, which are not necessarily to scale, like or corresponding parts are denoted by like or corresponding reference numerals.

FIG. 3A is a sectional end view along the line 3A-3A of FIG. 3.

FIG. 4A is a partial sectional view taken along the line 4A-4A of FIG. 4.

FIG. 8 is a schematic side view of the MEMS apparatus incorporated in a flow surface and in an off position.

FIG. 9 shows the MEMS apparatus of FIG. 8 in an on position.

DETAILED DESCRIPTION OF EXEMPLARY EMBODIMENTS OF THE INVENTION

One application of the invention is as a micro control surface to steer high-speed projectiles. The invention is command actuated to create lift on a projectile body or fin. The device offers the advantage of simple electrical actuation.

Figure 1:
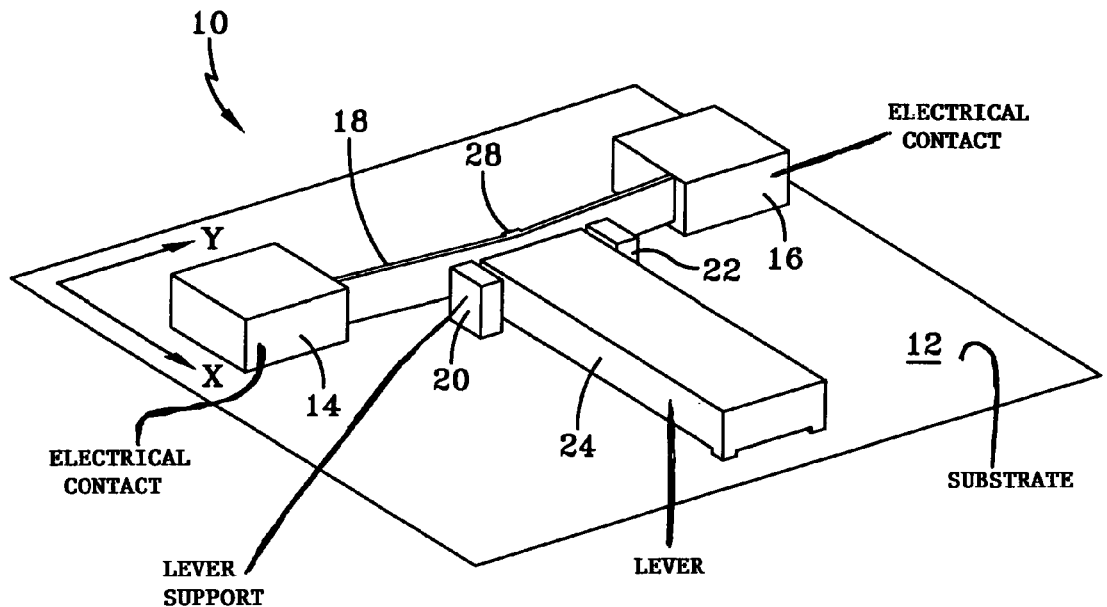
FIG. 1 is a schematic perspective view of a MEMS apparatus in an off position.
Figure 2:
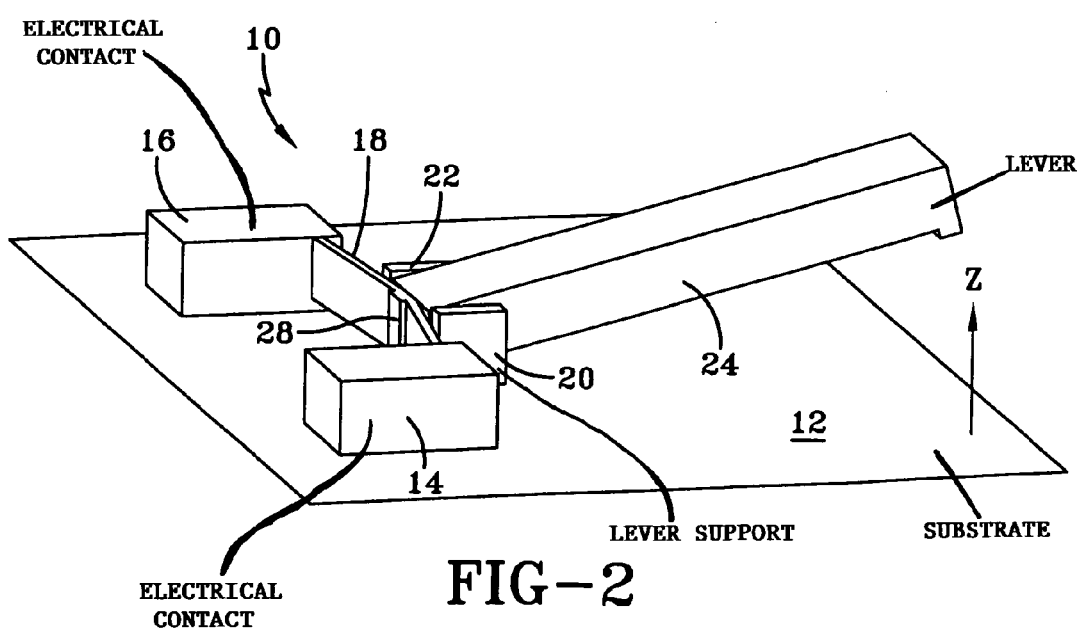
FIG. 2 is a schematic perspective view of the MEMS apparatus of FIG. 1 in an on position.

FIG. 1 is a schematic perspective view of the MEMS apparatus 10 in an off position. FIG. 2 is a schematic perspective view of the MEMS apparatus 10 of FIG. 1 in an on position. MEMS apparatus 10 comprises a substrate 12 that defines, for example, an XY plane. A pair of electrical contacts 14, 16 are disposed on the substrate 12. A thermal arch beam 18 is supported by and connected between the contacts 14, 16. A voltage difference applied between contacts 14, 16 causes thermal arch beam 18 to deflect in the in-plane X direction shown in FIG. 1. Thermal arch beams that provide planar deflection in response to an electrical current are known.

Figure 3:
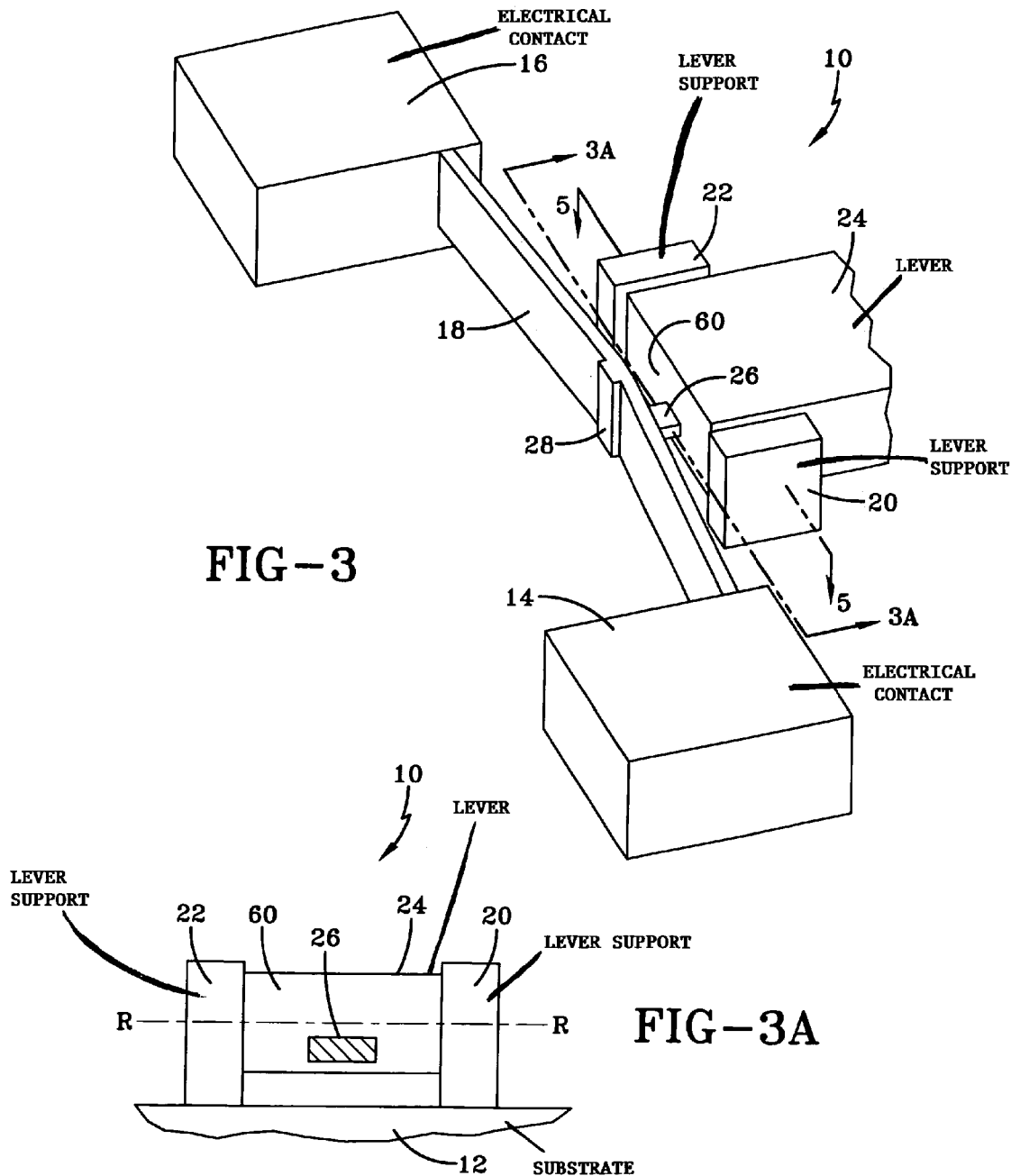
FIG. 3 is an enlarged view of a portion of the MEMS apparatus of FIG. 1, from a different angle.

Thermal arch beam 18 includes a midpoint 28 and a protrusion 26 (FIGS. 3 and 3A) located at about the midpoint 28. A lever 24 includes a bearing surface 60 upon which the protrusion 26 may bear. A pair of lever supports 20, 22 are disposed on the substrate 12 for rotatably supporting the lever 24 around an axis of rotation R-R (FIG. 3A). When beam 18 deflects in the X direction (FIG. 1) due to the voltage difference between contacts 14, 16, the beam protrusion 26 pushes against the bearing surface 60 of lever 24 causing rotation of the lever 24 in the Z direction out of the XY plane. The area of contact between the protrusion 26 and the bearing surface 60 is positioned vertically between the axis of rotation R-R and the plane of the substrate 12, as shown in FIG. 3A.

Figure 4:
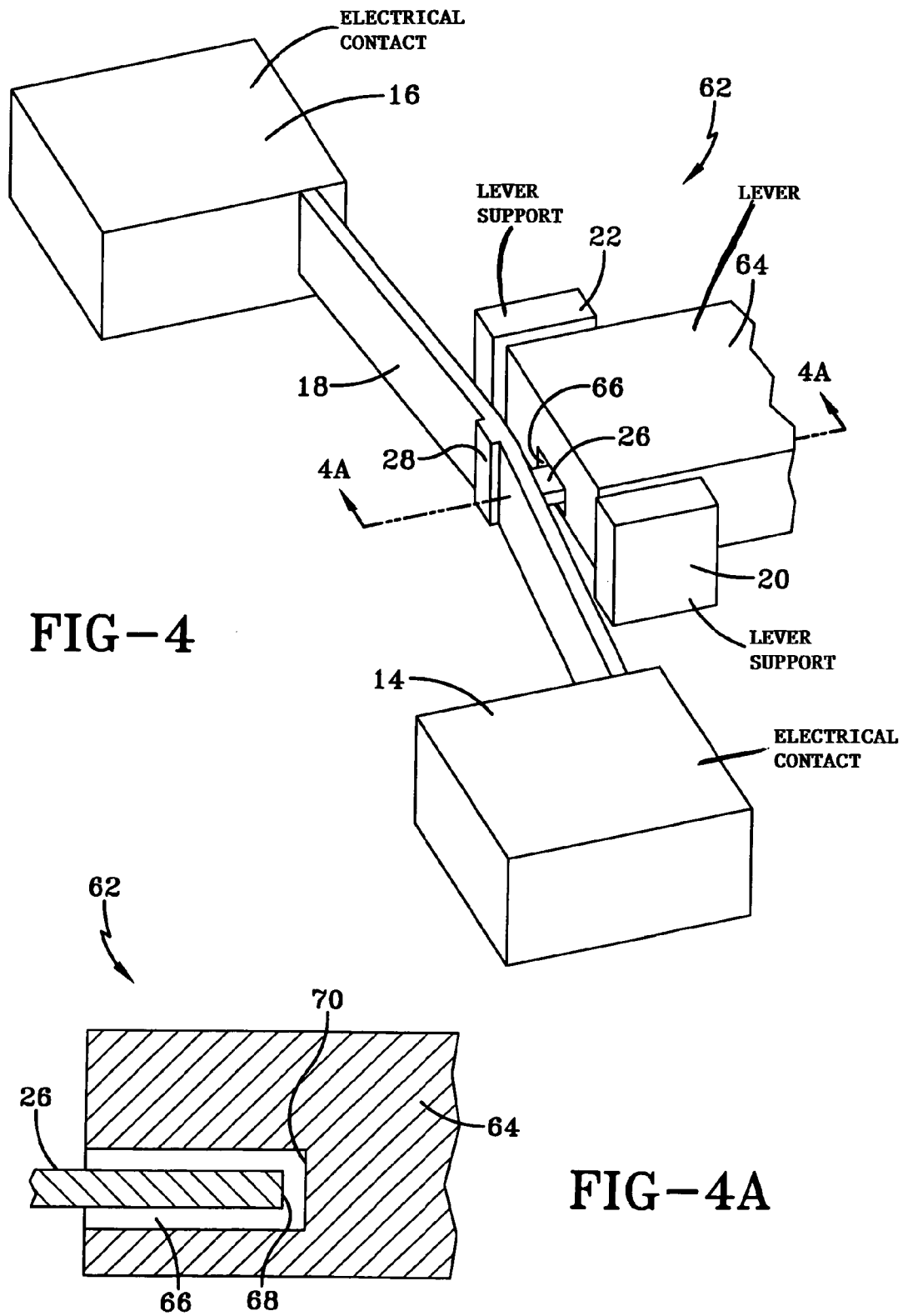
FIG. 4 is an enlarged view of a portion of an alternative embodiment of a MEMS apparatus.

FIG. 4 is an enlarged view of a portion of an alternative embodiment of a MEMS apparatus 62. FIG. 4A is a partial sectional view taken along the line 4A-4A of FIG. 4. MEMS apparatus 62 differs from apparatus 10 in that lever 64 includes an opening 66 formed in one end for receiving the protrusion 26 of the thermal arch beam 18. When beam 18 is actuated, the end 68 (FIG. 4A) of protrusion 26 pushes against interior wall 70 of lever 64, causing the lever 64 to rotate upward, as in FIG. 2. When the voltage across the contacts 14, 16 is reduced or removed, the beam 18 moves in the negative X direction and the lever 64 rotates downwardly towards the XY plane. As in MEMS apparatus 10, the area of contact between the protrusion 26 and the interior wall 70 is positioned vertically between the axis of rotation of the lever 64 and the plane of the substrate 12.

Figure 5:
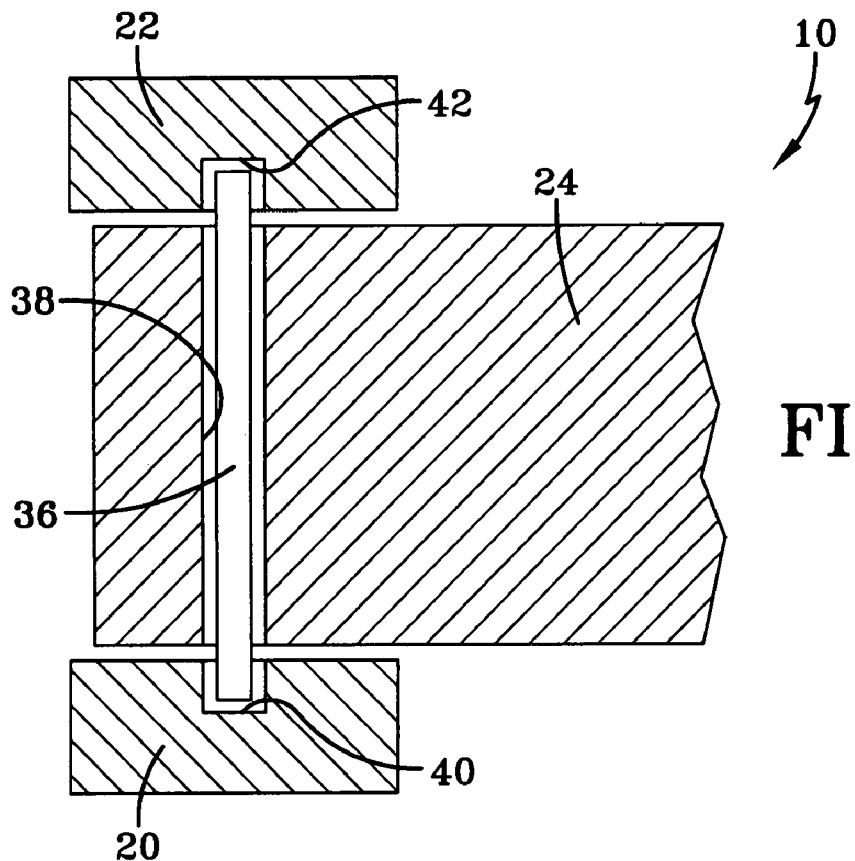
FIG. 5 is a partial sectional view taken along the line 5-5 of FIG. 3.

FIG. 5 is a partial sectional view taken along the line 5-5 of FIG. 3, showing one way of rotatably supporting the lever 24. In the embodiment of FIG. 5, the lever 24 includes a through hole 38 and lever supports 20, 22 include openings 40, 42, respectively. A shaft or axle 36 rests in openings 40, 42 and through hole 38. In FIG. 5, axle 30 is free to rotate with respect to both the lever 24 and the supports 20, 22.

Of course, other means may be used to rotatably support the lever 24. For example, the axle 36 may be fixed to or integral with the lever 24 and rotatable with respect to the lever supports 20, 22. Or, the axle 36 may be fixed to or integral with the lever supports 20, 22 and rotatable with respect to the lever 24. Or, axle 36 may be fixed to or integral with both lever 24 and lever supports 20, 22. In that case, the portions of the axle 36 extending between the lever 24 and the lever supports 20, 22 include torsion beams or torsion springs that twist when lever 24 rotates.

Figure 6:
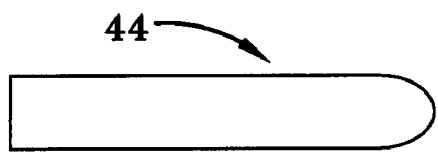
FIG. 6 is a schematic view of a projectile.
Figure 7:
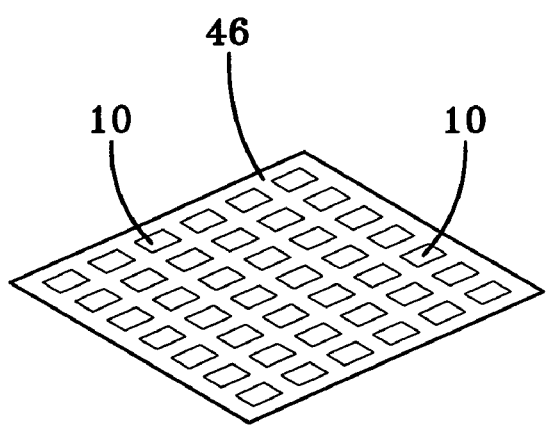
FIG. 7 is a schematic view of a projectile flow surface.

The MEMS apparatus 10 may also be used to steer a projectile. FIG. 6 shows a projectile 44. As used herein, a projectile 44 may be a missile, rocket or any type of projectile, with or without fins, that is launched in air or water. FIG. 7 shows a portion of a flow surface 46 of a projectile 44. The flow surface 46 may be the external surface of the projectile 44 or it may be the surface of a fin, wing, rudder, etc. A plurality of MEMS apparatus 10 (or apparatus 62) are disposed in an array on the flow surface 46. The MEMS apparatus 10 may be arrayed in any manner and number required to steer the projectile 44. When the levers 24 of the apparatus 10 are extended upward into the flow stream around surface 46, the ramps will influence the flow stream and alter the path of the projectile 44.

FIG. 8 is a schematic side view of one MEMS apparatus 10 incorporated in a flow surface 46 and in an off position. FIG. 9 shows the MEMS apparatus 10 of FIG. 8 in an on position. The MEMS apparatus 10 is disposed at the flow surface 46 such that, in the off position (FIG. 8), the lever 24 is substantially flush with the flow surface 46. In the on position (FIG. 9), the lever 24 extends out of the plane of the flow surface 46. The electrical contacts 14, 16 are connected to an onboard guidance and control system 48.

While the invention has been described with reference to certain exemplary embodiments, numerous changes, alterations and modifications to the described embodiments are possible without departing from the spirit and scope of the invention as defined in the appended claims, and equivalents thereof.

Finally, any numerical parameters set forth in the specification and attached claims are approximations (for example, by using the term "about") that may vary depending upon the desired properties sought to be obtained by the present invention. At the very least, and not as an attempt to limit the application of the doctrine of equivalents to the scope of the claims, each numerical parameter should at least be construed in light of the number of significant digits and by applying ordinary rounding.

What is claimed is:

1. A MEMS apparatus, comprising:
   a substrate defining a plane;
   a pair of electrical contacts being disposed on the substrate;
   a thermal arch beam being supported by and connecting between the contacts, the thermal arch beam includes a midpoint and a protrusion located at about the midpoint;
   a lever including an axis of rotation and a bearing surface upon which the protrusion is operable to bear;
   a pair of lever supports being disposed on the substrate for rotatably supporting the lever about the axis of rotation; and
   an area of contact between the protrusion and the bearing surface being positioned vertically between the axis of rotation and the plane of the substrate,
      wherein a voltage difference between the pair of electrical contacts causes horizontal movement of the thermal arch beam in the plane and the protrusion bears against the lever causing rotation of the lever out of the plane.

2. The MEMS apparatus of claim 1, wherein the lever further comprises an opening formed in one end to receive the protrusion of the thermal arch beam.

3. The MEMS apparatus of claim 1, further comprising openings in each of the pair of lever supports;
   a through hole being situated in the lever; and
   an axle being disposed in the through hole and the openings in the pair of lever supports,
      wherein the axle is configured for free rotation with respect to the lever and the pair of lever supports.

4. The MEMS apparatus of claim 1, further comprising openings in each of the pair of lever supports and an axle being fixed to the lever,
   wherein the axle is disposed in the openings in the lever supports and configured for free rotation with respect to the lever supports.

5. The MEMS apparatus of claim 1, further comprising a through hole being situated in the lever and an axle being fixed to the pair of lever supports,
   wherein the axle is disposed in the through hole in the lever and configured for free rotation with respect to the lever.

6. The MEMS apparatus of claim 1, further comprising an axle being fixed to the lever and the pair of lever supports, wherein the axle comprises a torsion spring operable to twist as the ramp rotates.

7. A projectile, comprising:
   a flow surface; and
   at least one MEMS apparatus comprising a substrate defining a plane; a pair of electrical contacts being disposed on the substrate; a thermal arch beam being supported by and connected between the contacts, the thermal arch beam includes a midpoint and a protrusion located at about the midpoint; a lever including an axis of rotation and a bearing surface upon which the protrusion is operable to bear; a pair of lever supports being disposed on the substrate for rotatably supporting the lever about the axis of rotation; and an area of contact being situated between the protrusion and the bearing surface being positioned vertically between the axis of rotation and the plane of the substrate,
   wherein a voltage difference between the pair of electrical contacts causes horizontal movement of the thermal arch beam in the plane and the protrusion bears against the lever causing rotation of the lever out of the plane, and
   wherein said at least one MEMS apparatus is disposed at the flow surface where the lever is substantially flush with the flow surface in an off position of said at least one MEMS apparatus, and the lever extends out of a plane of the flow surface in an on position of said at least one MEMS apparatus.

8. The projectile of claim 7, further comprising openings being situated in each of the pair of lever supports; a through hole being situated in the lever; and an axle being disposed in the through hole and the openings in the lever supports,
   wherein the axle is configured for free rotation with respect to the lever and the lever supports.

9. The projectile of claim 7, further comprising openings being situated in each of the pair of lever supports; and an axle being fixed to the lever,
   wherein the axle is disposed in the openings in said each of the pair of the lever supports for free rotation with respect to the lever supports.

10. The projectile of claim 7, further comprising a through hole being situated in the lever; and an axle being fixed to the pair of lever supports,
    wherein the axle is disposed in the through hole in the lever for free rotation with respect to the lever.

11. The projectile of claim 7, further comprising an axle being fixed to the lever and the pair of lever supports,
    wherein the axle comprises a torsion spring operable to twist as the ramp rotates.

12. The projectile of claim 7, further comprising a plurality of the MEMS apparatus being disposed at the flow surface.

13. The projectile of claim 12, further comprising a guidance and control system being connected to the pair of electrical contacts.

* * * * *